(12) United States Patent
Yamada

(10) Patent No.: US 7,194,013 B2
(45) Date of Patent: Mar. 20, 2007

(54) GAN SEMICONDUCTOR LASER DEVICE, AND OPTICAL DISK INFORMATION SYSTEM USING THE LASER DEVICE

(75) Inventor: Takao Yamada, Anan (JP)

(73) Assignee: Nichia Corporation, Tokushima (JP)

( * ) Notice: Subject to any disclaimer, the term of this patent is extended or adjusted under 35 U.S.C. 154(b) by 0 days.

(21) Appl. No.: 10/482,215

(22) PCT Filed: Jul. 2, 2001

(86) PCT No.: PCT/JP01/05689

§ 371 (c)(1),
(2), (4) Date: Jul. 21, 2004

(87) PCT Pub. No.: WO03/005515

PCT Pub. Date: Jan. 16, 2003

(65) Prior Publication Data

US 2004/0245534 A1     Dec. 9, 2004

(51) Int. Cl.
*H01S 5/00*     (2006.01)
(52) U.S. Cl. .................................. 372/50.1; 372/46.01
(58) Field of Classification Search ............. 372/50.1, 372/50.12, 50.121, 50.122, 46.01
See application file for complete search history.

(56) References Cited

U.S. PATENT DOCUMENTS

| | | | | |
|---|---|---|---|---|
| 4,092,659 A | * | 5/1978 | Ettenberg ................. | 372/49.01 |
| 4,689,125 A | * | 8/1987 | Burrus et al. ............... | 205/655 |
| 4,815,089 A | * | 3/1989 | Miyauchi et al. ......... | 372/49.01 |
| 4,899,359 A | * | 2/1990 | Yano et al. ............... | 372/44.01 |
| 5,136,572 A | * | 8/1992 | Bradley ....................... | 369/108 |
| 5,327,448 A | * | 7/1994 | Holonyak et al. ............. | 372/94 |
| 5,559,058 A | * | 9/1996 | Zory et al. ..................... | 438/10 |
| 5,812,576 A | | 9/1998 | Bour | |
| 5,982,799 A | * | 11/1999 | Bour et al. ............. | 372/50.121 |
| 6,031,858 A | | 2/2000 | Hatakoshi et al. | |
| 6,043,104 A | * | 3/2000 | Uchida et al. ................ | 438/32 |
| 6,167,074 A | * | 12/2000 | Sun et al. .............. | 372/50.122 |
| 6,618,420 B1 | * | 9/2003 | Gen-Ei et al. ............. | 372/50.1 |
| 2002/0071462 A1 | * | 6/2002 | Takemoto et al. ............ | 372/43 |

FOREIGN PATENT DOCUMENTS

| | | |
|---|---|---|
| EP | 0 206 642 | 12/1986 |
| JP | 59-123289 | 7/1984 |
| JP | 60-189281 | 9/1985 |
| JP | 61-116891 | 6/1986 |
| JP | 61-287289 | 12/1986 |
| JP | 62-102584 | 5/1987 |
| JP | 62-219589 | 9/1987 |
| JP | 64-074786 | 3/1989 |
| JP | 1-194377 | 8/1989 |

(Continued)

*Primary Examiner*—Sara Crane
(74) *Attorney, Agent, or Firm*—Wenderoth, Lind & Ponack, L.L.P.

(57) ABSTRACT

Two or more of striped structures are formed in one chip, and a relaxation oscillation frequency of the first striped structure is greater than a relaxation oscillation frequency of the second striped structure. An RIN value at low output is improved by the first striped structure having a higher relaxation oscillation frequency, and a single transverse mode and reliability at high output are obtained by the second striped structure having a lower relaxation oscillation frequency.

16 Claims, 5 Drawing Sheets

FOREIGN PATENT DOCUMENTS

| | | |
|---|---|---|
| JP | 1-194381 | 8/1989 |
| JP | 10-093200 | 4/1998 |
| JP | 10-294529 | 11/1998 |
| JP | 2000-101197 | 4/2000 |
| JP | 2000-163780 | 6/2000 |
| JP | 2000-174346 | 6/2000 |
| JP | 2000-332341 | 11/2000 |

* cited by examiner

GAN SEMICONDUCTOR LASER DEVICE, AND OPTICAL DISK INFORMATION SYSTEM USING THE LASER DEVICE

FIELD OF THE INVENTION

The present invention relates to a GaN-based semiconductor laser device using a gallium nitride-based compound semiconductor ($In_xAl_yGa_{1-x-y}N$, $0 \leq x$, $0 \leq y$, $x+y \leq 1$), and specifically to a GaN-based laser device of a multipoint luminescence type comprising multiple striped structures in one chip.

DESCRIPTION OF BACKGROUND ART

Recently, with practical application of a GaN type laser diode, development of an optical disc information system which performs high density recording to an optical disc by using a light having a short wave length in a range from 380 nm to 430 nm is active. In these optical disc systems, reading from an optical disc is performed at a low power and writing to an optical disc is performed at a high output. A GaN-based laser diode having a single striped structure has been used as a light source, and both of reading and writing are performed by changing an output of the laser diode.

However, in a case where reading and writing are performed with a typical GaN-based laser diode having a single striped structure, there has been the following problems when data are transferred at high speed with a high reading/writing ratio (hereinafter referred to as RW ratio) of laser output. In an optical information disc system, it is necessary for reading to maintain a value of relative intensity noise (hereinafter referred to as RIN value) low, and for writing to generate a high output with a single transverse mode for a longer operating life. However, it is difficult to maintain the RIN value at a level necessary for reading by simply decreasing output at reading in order to increase the RW ratio, because the RIN value generally decreases as output decreases. On the other hand, it is also difficult to maintain a single transverse mode and a long operating life of the laser element by simply enhancing output at writing in order to increase the RW ratio, because the single transverse mode and the operating life decreases as the output rises.

Also, in design of a laser having a striped structure, a high maximum output cannot be obtained when it is designed to decrease a lower RIN value at a low output. On the contrary, in a design to obtain a high maximum output, the RIN value at a low power output increases, so that it is difficult to satisfy both of these properties with a single laser striped structure.

For this reason, it is difficult to transfer data at high speed with a high RW ratio at high speed while maintaining a necessary RIN value and a longer operating life, when a GaN-based laser diode with a typical single striped structure is used to perform both reading and writing.

It is therefore an object of the present invention is to provide a GaN-based semiconductor laser device which can transfer data with a high RW ratio at high speed while maintaining a necessary RIN value for an optical disc information system and a longer operating life.

SUMMARY OF THE INVENTION

In order to achieve the above object, a GaN-based semiconductor laser device of the present invention includes a first striped structure having a first relaxation oscillation frequency $fr_1$ and a second striped structure having a second relaxation oscillation frequency $fr_2$ in one chip, and the first relaxation oscillation frequency $fr_1$ is greater than the second relaxation oscillation frequency $fr_2$.

Thus, a first feature of the present invention is that two or more striped structures are formed in one chip, and one striped structure is used for low power and another striped structure is used for high power. By such structure an excellent performance at both low and high power can be obtained. Here, the striped structure may be a striped ridge structure as shown in the figures, or a striped opening structure such as a current constriction structure. This structure can be applied to an edge emitting laser element having a striped shape waveguide and a plurality of luminous points corresponding to each waveguide. Also, it can apply to a surface-emitting laser element which has a plurality of waveguides and a plurality of luminous points. Moreover, the present invention can apply to both a free-running oscillation laser element and a non-free-running oscillation laser element having a relaxation oscillation frequency described above.

A second feature of the present invention is that a striped structure having a larger relaxation oscillation frequency fr and a striped structure having a smaller relaxation oscillation frequency fr are formed, for a reason that a value of a relaxation oscillation frequency fr of a laser diode has a large effect on an RIN-Power property. An RIN value at a low output is improved because of the striped structure having a higher relaxation oscillation frequency, and a single transverse mode at high power and reliability can be secured because of the striped structure having a smaller relaxation oscillation frequency.

Therefore, in a case where the GaN-based laser device of the present invention is used for an optical disc information system, the first striped structure having a higher relaxation oscillation frequency fr1 is used as a light source for reading, and the second striped structure having a smaller relaxation oscillation frequency fr2 is used as a light source for writing. Additionally, in a case where the GaN-based laser device of the present invention is used for both of reading and writing, it is preferable that the first striped structure and the second striped structure can be driven independently. It is also preferable that a difference of emission wavelengths between the first striped structure and the second striped structure is within 5 nm.

The relaxation oscillation frequency fr1 of the first striped structure and fr2 of the second striped structure can be determined by an optical wave pattern of relaxation oscillation when a pulsed current is applied at the same temperature, the same condition, and the same output. FIG. 3 is a graph showing one example of an optical wave pattern of relaxation oscillation measured under 25° C. with a pulse width of 10 ns, a pulse cycle of 20 ns, and a zero bias of 5 mW. When a peak interval of an optical wave pattern of relaxation oscillation is determined as d (s), the relaxation oscillation frequency fr satisfies fr=1/d (Hz).

Optimization of the striped structures for a lower output and a higher output because of the relaxation oscillation frequency is described in the following. FIG. 4 is a graph showing a relationship between an RIN value and an output P of the GaN-based laser diode at a high frequency superimposed drive. As can be seen in FIG. 4, the RIN value decreases linearly as the output P of a laser diode gradually increases. However, when the output reaches a certain level, the RIN value decreases to a minimum value, then increases to a maximum value and then decreases again. Typically, a laser diode is designed for an output around or slightly above the minimum value. However, when an RIN-Power property is optimized according to high output P2 for writing (shown as curve 22 in FIG. 4), the RIN value becomes very large at a low output P1 for reading. On the other hand, the RIN-Power curve can be shifted to the lower output side by increasing the relaxation oscillation frequency fr (shown as curve 20 in FIG. 4). Therefore, the RIN value for reading can be decreased to a necessary level by forming another striped structure having a higher relaxation oscillation frequency fr according to the low output $P_1$ for reading.

An RW ratio needed for a general optical disc information system is about 15 for a normal writing speed. The RW ratio needs to be increased $n^{1/2}$ times when the writing speed is increased n times. Therefore, it is preferable that a difference between the first relaxation oscillation frequency $fr_1$ and the second relaxation oscillation frequency $fr_2$ is greater at a higher writing speed. That is, x which is defined in $x=(fr_1-fr_2)/fr_2$ is preferably equal to or greater than 0.1, more preferably equal to or greater than 0.3 and further preferably equal to or greater than 0.6.

The relaxation oscillation frequency can be expressed in Equation 1. In the equation, ξ is an integral gain, is an optical confinement rate, $\eta_{sep}$ is a front face slope efficiency, $P_{out}$ is a front face output power, e is an elementary charge, V is a volume of active region (equal to a product of a cross-sectional area of a light emitting region and a length of a resonator), and $\eta_1$ is an internal differential quantum efficiency.

$$fr = \left[\frac{\left(\frac{a\xi\eta_{sep}P_{out}}{eV\eta_1}\right)^{\frac{1}{2}}}{2\pi}\right] \quad \text{(Equation 1)}$$

Therefore, the relaxation oscillation frequency $fr_1$ of the first striped structure and $fr_2$ of the second striped structure can be controlled by adjusting the optical confinement rate ξ of the first and the second striped structures or a structural parameter of volume V.

For example, to make the optical confinement rate ξ of the first striped structure lower than that of the second striped structure ($fr_1>fr_2$), an average of front face reflectance and back face reflectance of the first striped structure is made larger than that of the second striped structure. Besides, a ratio of equivalent reflective indexes of a wave guide portion to a peripheral portion of the first striped structure may be made greater than that of the second structure. For example, in a case where the first and the second striped structures have a ridge shape, a ridge depth of the first striped structure is made greater than that of the second striped structure.

To reduce the volume V of the active region in the first structure to less than that of the second striped structure and obtain $fr_1>fr_2$, a width of the first striped structure may be made narrower than that of the second structure, or the resonator of the first striped structure may be made shorter than that of the second striped structure.

It is preferable that active layers of the first striped structure and the second striped structure have the same composition and the same height so as to simplify a process by forming the active layers at the same time and control a fluctuation in an emission wavelength. It is also preferable to form cladding layers of the first striped structure and the second striped structure with the same composition and the same height.

The GaN-based semiconductor laser device may have two or more striped structures in one chip. However, it is preferable that the striped structures are formed close to each other to an extent that the striped structures can be formed and a distance between each center of the striped structures is less than or equal to 150 μm. This is because a disturbance occurs in an interaction of signals to and from an optical disc information system if the distance between each striped structures is greater than 150 μm.

The optical disc information system according to present invention employs a light between 380 and 430 nm for reading from and writing to an optical disc, and includes a GaN-based semiconductor laser device whose first striped structure is used as a light source for reading and whose second striped structure is used as a light source for writing. The optical disc information system of the present invention can perform data transfer at a high speed with a high RW ratio, while maintaining a necessary noise level and operating life.

DETAILED DESCRIPTION OF THE PREFERRED EMBODIMENTS

The preferred embodiments of the present invention will now be described with reference to the accompanying drawings.

Embodiment 1

Figure 1:
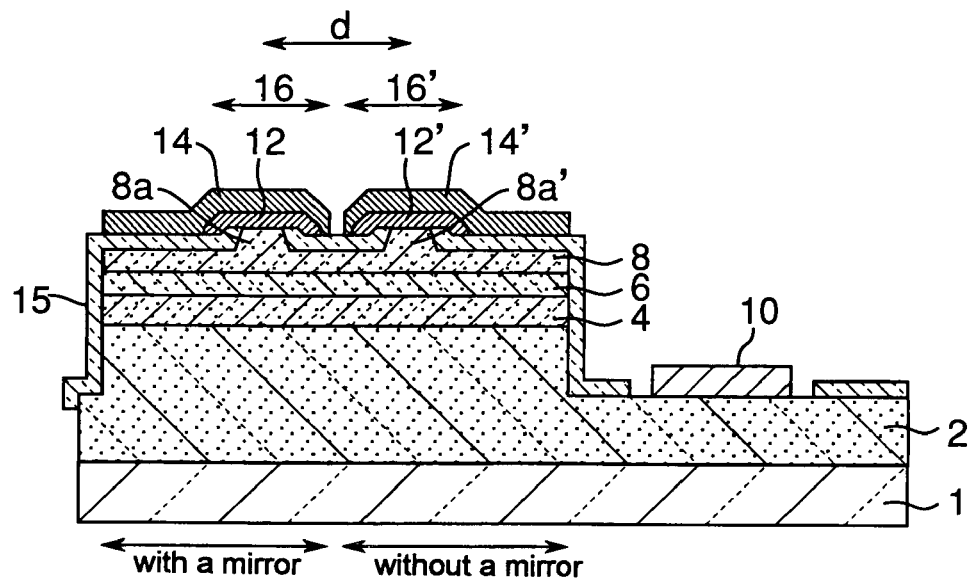
FIG. 1 is a sectional view illustrating a GaN-based semiconductor laser device according to a first embodiment of the present invention.

FIG. 1 is a schematic cross-sectional view showing a semiconductor laser device according to preferred embodiment 1 of the present invention. The semiconductor laser device, shown in FIG. 1 is a ridge waveguide GaN-based semiconductor laser device having a double hetero structure comprising a quantum well active layer 6 including $In_xGa_{1-x}N(0<x<1)$ which is formed between an n-type cladding layer 4 including $Al_yGa_{1-y}N(0<y<1)$ and a p-type cladding layer 8 including $Al_zGa_{1-z}N(0<z<1)$, and also having a striped structure formed by making a part of the p-type cladding layer into a ridged shape. Two ridges are adjacently formed parallel to each other and construct two striped structures 16 and 16'.

In the semiconductor laser device shown in FIG. 1, an average of reflectances of a front end face and back end face in the striped structure 16 is about 65 to 85%, and an average of reflectance of a front end face and back end face in the striped structure 16' is about 50 to 60%. For example, a mirror having a reflectance of about 40% is formed only on a part of a front face of a resonator end face corresponding to the striped structure 16, and no mirror is formed on a part of a front face of a resonator end face corresponding to the striped structure 16'. A mirror having a reflectance of about 90% is formed on the back end faces of the striped structure 16, and 16'.

A relaxation oscillation frequency $f_1$ of the striped structure 16 which is formed as described above is about 30 to 50% greater than a relaxation oscillation frequency $f_2$ of the striped structure 16'. As mentioned above, it is advantageous for raising an RW ratio when a difference in the relaxation oscillation frequencies between the two striped structures is great. For example, obtaining appropriate RIN value and life, x, which is described as: $x=(fr_1-fr_2)/fr_2$, is greater than or equal to 0.1, more preferably greater than or equal to 0.3, further preferably greater than or equal to 0.6.

Figure 4:
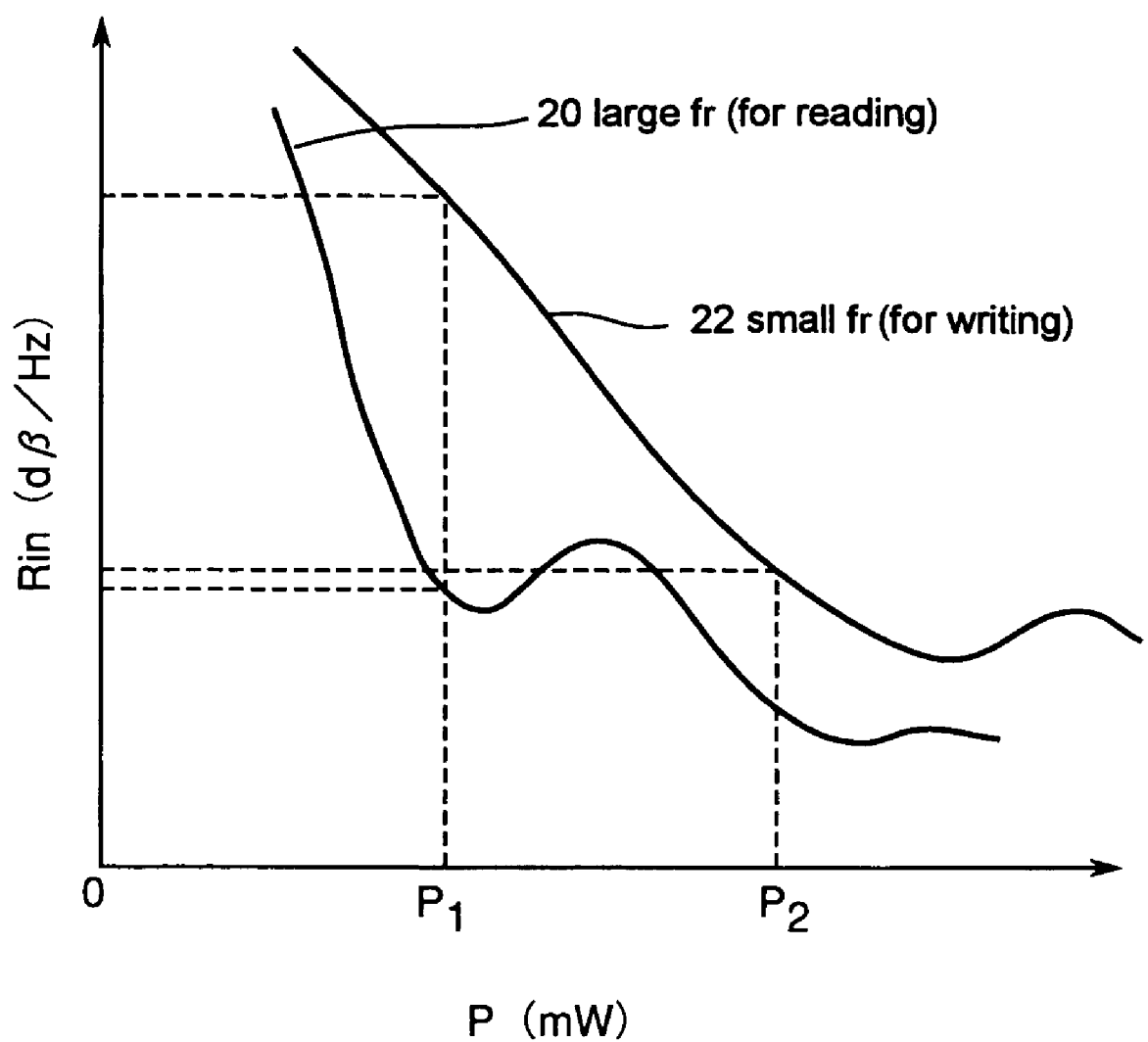
FIG. 4 is a graph showing an example of an RIN-Power feature.

An RIN-Power characteristic of the striped structure 16 has a minimum value of 1.5 to 2.0 mW as shown by curve 20 in FIG. 4, and an RIN-Power characteristic of the striped structure 16' has a minimum value of 4.0 to 5.0 mW as shown by curve 22 in FIG. 4. Thus, an RIN value of 125 dB/Hz or less at a low output of about 1.5 to 3.0 mW can be obtained by using the striped structure 16 of semiconductor laser device shown in FIG. 1 as a reading light source for an optical disc information device. Also, a sufficient lifetime at high output of about 40 to 70 mW can be obtained by using the striped structure 16' as a writing light source for an optical disc information device.

Structure of this GaN-based laser device shown in FIG. 1 is hereafter described in detail. GaN is preferably used as substrate 1. However, a foreign substrate different from a nitride semiconductor can also be used. The foreign substrate may be of a material different from the nitride semiconductor which has been known to be able to grow a nitride semiconductor thereon, such as sapphire having a C plane, R plane or A plane as a principle plane, an insulating substrate such as spinel ($MgAl_2O_4$), SiC (including 6H, 4H and 3C), ZnS, ZnO, GaAs, or Si, an oxide substrate that lattice-matches with nitride semiconductors, or the like. Sapphire and spinel are preferable foreign substrates. After a base layer of a nitride semiconductor is formed on the foreign substrate prior to forming a device structure, the device structure may be formed on this single substrate, which is made by removing the foreign substrate, by a method such as polishing. Or, the foreign substrate may be removed after the device structure is formed.

An n-type nitride semiconductor layer of n-type contact layer 2, and the n-type cladding layer 4 are formed on the substrate 1 via a buffer layer (not shown). An n-type optical guide layer can be formed between the n-type cladding layer 4 and the active layer 6. At least a part of the n-type semiconductor layer which is made to be in contact with the active layer 6 is needed to have a wider band gap than that of the active layer 6, so that a composition including Al is preferable. Moreover, each layer can be grown to an n-type with doping of an n-type impurity, or without doping impurities.

The active layer 6 is formed on the n-type semiconductor layers 2 and 4. The active layer 6 has an MGW structure where a well layer of InGaN ($0<_{x1}<1$) and a barrier layer of InGaN ($0\leq_{x2}<1$, $_{x1}>_{x2}$) are repeatedly formed to an appropriate number of times. Both ends of the active layer are barrier layers. The well layers are formed without doping and all barrier layers are doped with an n-type impurity such as Si and Sn with preferable concentrations of $1\times10^{17}$ to $1\times10^{19}$ $cm^{-3}$.

The p-type cladding layer 8 is formed as a p-type nitride semiconductor layer on a final barrier layer. A p-type electron confinement layer or a p-type optical guide layer can be formed between the p-type cladding layer 8 and the active layer 6. At least a part of the p-type cladding layer 8 which is made to contact with the active layer 6 is needed to have a wider band gap than that of the active layer 6, so that a composition including Al is preferable.

Two ridge stripes 8a and 8a' are formed halfway in the p-type cladding layer 8 in a case where the p-type optical guide layer is formed to a mid-portion thereof, and two striped structures 16 and 16' are constructed. These device layers such as the n-type cladding layer 4, the active layer 6, and the p-type cladding layer 8 are common in the striped structures 16 and 16'. The two ridge stripes 8a and 8a' are formed of the same shape and parallel to each other. A distance d between centers of the ridge stripes is preferably at most 150 µm, and more preferably at most 70 µm. When the distance d between the centers is shorter, shifts of luminous points between reading and writing can be made smaller. P-type electrodes 12 and 12' and p-type pad electrodes 14 and 14' are formed on each of the two ridge stripes 8a and 8a'. The p-type electrodes 12 and 12' and the p-type pad electrodes 14 and 14' are formed separately on each striped structure so as to drive the striped structures 16 and 16' independently.

Furthermore, an n-type electrode 10 is formed on a surface of the n-type contact layer 2 exposed by removing upper layers. The n-type electrode 10 is common to the striped structures 16 and 16'. As mentioned above, in a case where the p-type electrode and the n-type electrode are formed on the same face of the substrate and the n-type electrode is common to two striped structures, physical relationships of the n-type electrode 10, the striped structure 16 for reading, and the striped structure 16' for writing are not specifically limited; however, it is preferable that common n-type electrode 10 is formed adjacent to the striped structure for writing where a relatively large current is applied. With this structure, luminous efficiency can be improved by reducing a current path to the striped structure 16' for writing. Meanwhile, structure of the n-type electrode is not specifically limited, and the n-type electrode can be formed on each striped structure independently or on a rear face instead of the same face side of the substrate.

A mirror having a reflectance of about 90% is formed on almost an entire area of the back end face of the resonator (monitoring face) of these obtained striped structures 16 and 16'. A mirror having a reflectance of about 40% is formed only on the front end face of the resonator (light emitting face) on a side of the striped structure 16. An end face formed by cleaving or etching can be used for a part on the front face of the resonator corresponding to the striped structure 16'. Materials used for the mirror are not specifically limited and $SiO_2$, $Al_2O_3$, $TiO_2$, $ZrO_2$ or the like can be used.

In this embodiment, an optical confinement rate between the striped structures 16 and 16' is adjusted by presence of the mirror on the front end face of the resonator; however mirror construction is not specifically limited if an average of reflectances of the front and back end faces can be adjusted to a required ratio between the striped structures. For example, the mirrors may be formed on both front and back faces of the both striped structures with only the mirror reflectances being different from one another.

Embodiment 2

Figure 2:
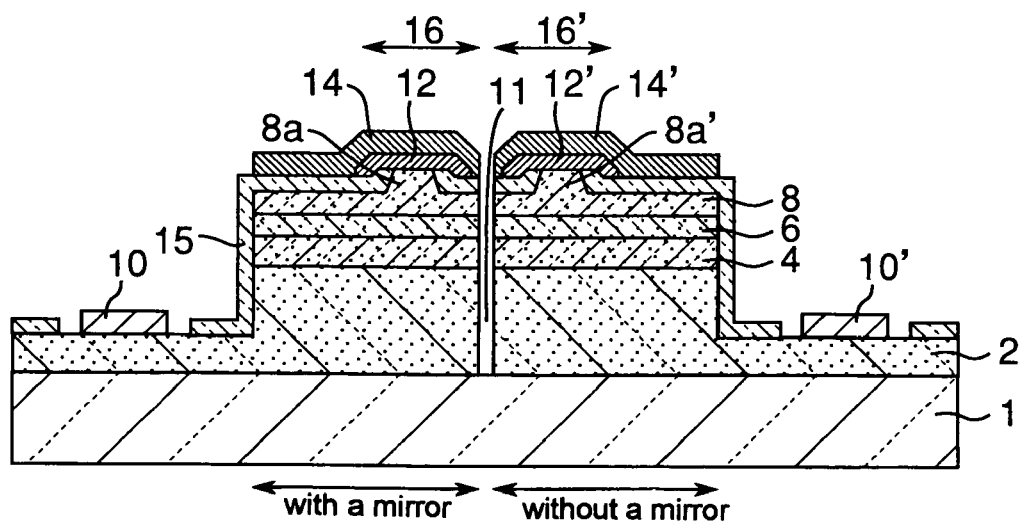
FIG. 2 is a sectional view illustrating a GaN-based semiconductor laser device according to a second embodiment of the present invention.
Figure 3:
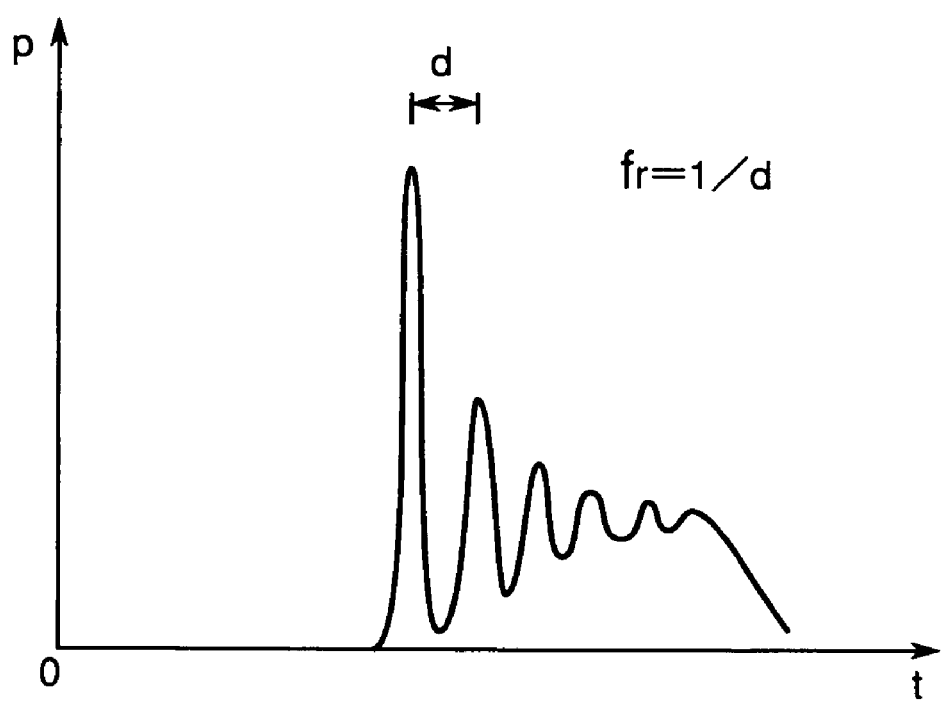
FIG. 3 is a graph showing an example of a relaxation oscillation optical wave pattern.

FIG. 2 is a schematic sectional view of a GaN-based semiconductor laser device according to Embodiment 2. In this embodiment, n-electrodes 10 and 10' are formed independently on regions between which are the striped structures, and a trench 11 is formed between the striped structures through all element layers from n-type contact layer 2 to p-type cladding layer 8. Other processes are performed in the same manner as in Embodiment 1.

Figure 5:
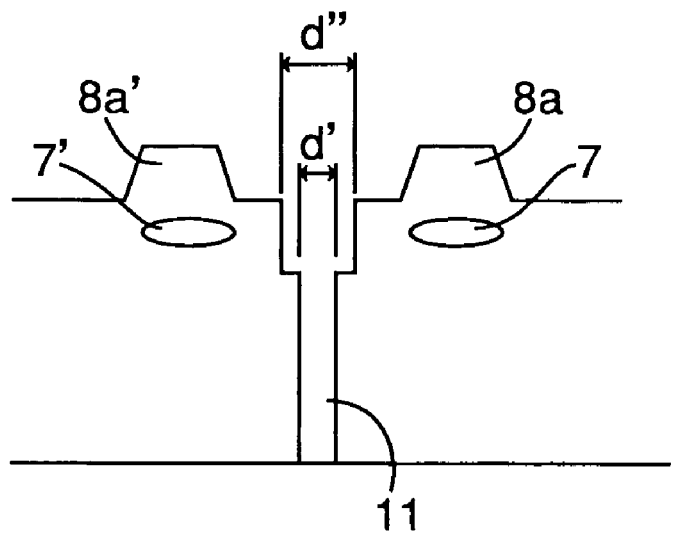
FIG. 5 is a schematic view showing a shape of a trench formed in a ridged portion.

According to the current embodiment, an overlapping of a current path in striped structure for reading 16 and striped structure for writing 16' can be completely eliminated, so that noise which appears in a laser beam with simultaneous drive can be greatly reduced. Also, as shown in FIG. 5, width d' of the trench 11 can be widened to d" in the vicinity of luminous points 7, in order to control the noise more effectively.

Embodiment 3

In Embodiments 1 and 2, a relaxation oscillation frequency is adjusted by changing a construction of a resonator mirror. In this embodiment, the relaxation oscillation frequency is adjusted by changing a width and depth of ridge parts in striped structures. A mirror construction is common to the striped structures and other processes are performed in the same manner as in Embodiments 1 and 2, except that shapes of ridge parts 8a are different from each other.

Figure 6A:
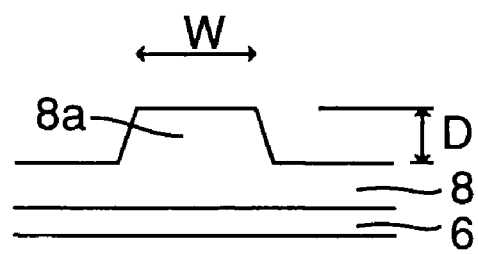
FIGS. 6A and 6B are schematic views showing a structure of a ridged portion.

FIG. 6A is a schematic view showing a shape of a ridge part of p-type cladding layer 8. Widths W and depths D of the ridge parts are made to differ in striped structures 16 and 16'. That is, a shape of ridge part 8a in the stripe structure 16 for reading is adjusted so that the width W is narrower and the depth D is deeper than in the striped structure 16'. Volume V of an active region can be reduced by narrowing the width W and a difference in refractive indexes Δn in a lateral direction in the ridge parts becomes greater by deepening the depth D, so that optical confinement rate ξ can be raised. Thus, as shown in above-mentioned equation 1, the relaxation oscillation frequency $fr_1$ of the striped structure 16 can be made greater than the relaxation oscillation frequency $fr_2$ of the striped structure 16'.

Figure 6B:
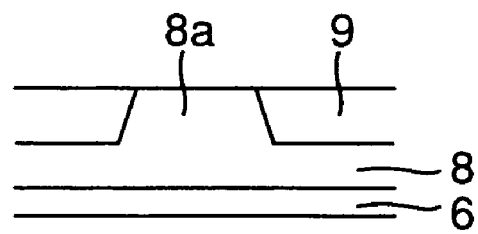

Furthermore, as shown in FIG. 6B, in order to increase a difference in the optical confinement rate between the striped structures, ridge part 8a of the striped structures can be embedded with a different material 9, and presence and composition of this embedding material may be changed between the striped structures.

Embodiment 4

In Embodiments 1 and 2, the relaxation oscillation frequency is adjusted by changing the mirror structures of the resonator. In this embodiment, the relaxation oscillation frequency is adjusted by changing resonator lengths between striped structures. A mirror structure is common to the striped structures and other processes are performed in the same manner as in Embodiments 1 and 2 except that resonator lengths differ between the striped structures.

Figure 7:
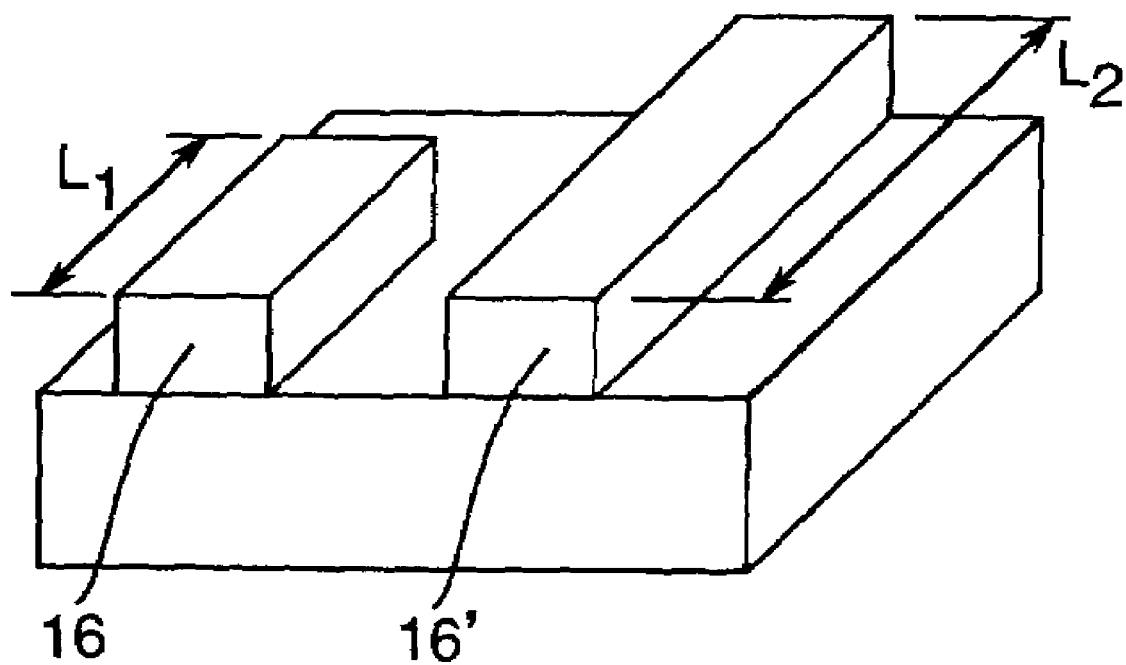
FIG. 7 is a schematic view showing a structure having resonators of different lengths for generating different relaxation oscillation frequencies.

FIG. 7 is schematic view showing striped structures formed next to each other. The resonator lengths are made to differ between the striped structures 16 and 16'. That is, resonator length $L_1$ of striped structure for reading 16 is made shorter than resonator length $L_2$ of the striped structure 16'. Volume V of an active region in the striped structure 16 can be made smaller than that of the striped structure 16' by making the resonator length $L_1$ shorter. Thus, as shown in the above-mentioned equation 1, the relaxation oscillation frequency $fr_1$ of the striped structure 16 can be made greater than the relaxation oscillation frequency $fr_2$ of the striped structure 16'.

In Embodiments 1 to 4, processes for varying the relaxation oscillation frequencies between the striped structures by changing the mirror structures, the ridge shapes, and the resonator length are explained. These processes may not only be employed independently but can also be properly combined. All other possibilities are accepted to use if they are means to vary parameters shown in equation 1; that is, integral gain a, optical confinement rate ξ, front face slope efficiency $\eta_{sep}$, front face output power $P_{out}$, volume of active region V and internal differential quantum efficiency $\eta_i$ between the striped structures.

In Embodiments 1 to 4, only constructions with two striped structures are described; however, three or more striped structures may be formed with different relaxation oscillation frequencies according to properties needed, respectively.

Examples related to present invention will be described below.

EXAMPLE 1

A GaN-based semiconductor device having the structure, shown in FIG. 2, is formed as described below.

(Substrate)

A foreign substrate which is made of sapphire having a c-plane as a principal plane and a diameter of 2 inches is set in a MOVPE reaction vessel. A temperature is adjusted to 500° C. and a buffer layer made of GaN is formed to a thickness of 200 Å, by using trimethyl gallium (TMG) and ammonia ($NH_3$). Then, the temperature is raised and a foundation layer made of undoped GaN is grown to a thickness of 1.5 μm. A plurality of striped masks is formed on a surface of the foundation layer, and a nitride semiconductor, GaN in this example, is selectively grown from an opening of the masks (window portion). Thus, a nitride semiconductor substrate having a nitride semiconductor layer which is formed with lateral growth (ELOG) is obtained. In this instance, the mask used in selective growth is comprised of $SiO_2$ with a mask width of 15 μm and an opening width (window portion) of 5 μm.

(Buffer Layer)

After forming the buffer layer on the nitride substrate, the temperature is adjusted to 1050° C. and a buffer layer comprising $Al_{0.05}Ga_{0.95}N$ is formed to a thickness of 4 μm by using TMG (trimethyl gallium), TMA(trimethyl aluminum), and ammonia. This layer functions as a buffer layer between an n-type contact layer comprising AlGaN and the nitride semiconductor substrate comprising GaN. Next, each layer that becomes a device structure is laminated on an underlayer that comprises a nitride semiconductor.

(N-Type Contact Layer 2)

Then, an n type contact layer 2 comprising $Al_{0.05}Ga_{0.95}N$ doped with Si is formed to a thickness of 4 μm at 1050° C. on this obtained buffer layer, by using TMG, TMA, ammonia, and silane gas as an impurity gas.

(Crack Prevention Layer)

Then, a crack prevention layer comprising $In_{0.06}Ga_{0.94}N$ is formed to a thickness of 0.15 μm at 800° C. by using TMG, TMI (trimethl indium), and ammonia.

(N-Type Cladding Layer 4)

Next, the temperature is adjusted to 1050° C., and an A layer comprised of undoped $Al_{0.05}Ga_{0.95}N$ is grown to a thickness of 25 Å by using TMA, TMG and ammonia as a source gas. Supply of TMA is then stopped and a B layer comprising GaN doped with Si in concentration of $5\times10^{18}/cm^3$ is grown to a thickness of 25 Å by using silane gas as an impurity gas. Then, an n-type cladding layer consisting of a multiple layer (super lattice structure) with a total thickness of 1 μm is formed by repeating each of the above operations 200 times to laminate the A layer and the B layer.

(N-Type Optical Guide Layer)

Then, at the same temperature, an n-type optical guide layer comprising undoped GaN is grown to a thickness of 0.15 μm by using TMG and ammonia as a source gas. Additionally, an n-type impurity can be doped.

(Active Layer)

Then, the temperature is adjusted to 800° C. Barrier layer (B) comprising $In_{0.05}Ga_{0.95}N$ doped with Si in a concentration of $5\times10^{18}/cm^3$ is grown to a thickness of 140 Å by using TMI, TMG, and ammonia as a source gas, and silane gas as an impurity gas.

Supply of silane gas is then stopped, and well layer (w) comprising undoped $In_{0.1}Ga_{0.9}N$ is grown to a thickness of 55 Å. This barrier layer (B) and the well layer (w) are laminated in sequence of (B)/(W)/(B)/(W). Finally, undoped $In_{0.05}Ga_{0.95}N$ is grown as a barrier layer by using TMI (trimethl indium), TMG and ammonia as a source gas. This active layer becomes a multiquantum well structure (MQW) of total thickness of about 500 Å.

(P-Type Electron Confinement Layer)

Next, a p-type electron confinement layer comprising $Al_{0.3}Ga_{0.7}N$ doped with Mg in a concentration of $1\times10^{19}/cm^3$ is grown to a thickness of 100 Å by using TMA, TMG and ammonia as a source gas and $Cp_2Mg$ (cyclopentadienyl magnesium) as an impurity gas.

(P-Type Optical Guide Layer)

Then, the temperature is adjusted to 1050° C. and a p-type optical guide layer comprising undoped GaN is grown to a thickness of 0.15 μm by using TMG and ammonia as a source gas. This p-type optical layer is grown as an undoped layer; however, diffusion of Mg from adjacent layers such as p-type optical guide layer 108 and the p-type cladding layer 109 increases Mg concentration to $5\times10^{16}/cm^3$ and turns to be of a p-type.

(P-Type Cladding Layer 8)

Subsequently, a layer comprising undoped $Al_{0.05}Ga_{0.95}N$ is formed to a thickness of 25 Å. Supply of TMA is then stopped, and a layer comprising Mg doped GaN is grown to a thickness of 25 Å using $Cp_2Mg$. P-type cladding layer 8 made of a super lattice structure with a total thickness of 0.45 μm is grown by repeating this operations 90 times.

(P-Type Contact Layer)

Finally, a p-type contact layer made of p-type GaN doped with Mg in a concentration of $1\times10^{20}/cm^3$ is grown to a thickness of 105 Å on the p-type cladding layer 8 at 1050° C. After reaction ends, annealing is performed on the wafer in the reaction vessel in a nitrogen atmosphere at 700° C., so as to further lower resistance of the p-type layer.

After growing the nitride semiconductor and laminating each layer as described above, etching is performed by way of RIE (reactive ion etching) with $Cl_2$ gas, so as to expose a surface of the n-type contact layer 2 whereon an n-electrode is to be formed, as shown in FIG. 2. At the same time, a front end face and a back end face of etching end faces are formed to become a resonator face. In the vicinity of a center of this element, trench 11 which reaches substrate 1 is formed with a width of 20 μm. The trench 11 is further expanded to a width of 40 μm to reach the buffer layer, as described in FIG. 5. As just described, $SiO_2$ is best as a protective film for deep etching of a nitride semiconductor.

Next, the striped ridges 8a and 8a' are formed on the opposite sides of the trench 11 as a striped waveguide region. An oxide of Si (mainly $SiO_2$) is used for a protective film for forming the striped ridges. Width W of a top surface of each ridge is 1.8 μm, depth D of each ridge is 0.5 μm, and a distance between centers of the two ridges is 50 μm. Here, the depth of the striped ridge is a depth to a remaining portion of the p-type optical guide layer, to where etching is performed through the p-type contact layer and the p-type cladding layer.

After the striped ridges are formed, protective film 15 made of an Zirconium oxide (mainly $ZrO_2$) is disposed on sides of the striped ridges and a continuous plane thereof except on the trench 11 and the striped ridges 8a and 8a'.

Then, the p-electrodes 12 and 12' comprising Ni/Au are formed on a top surface of the p-type contact layer in exposed portions of the striped ridges. On an already exposed top surface of the n-type contact layer 2, the striped n-type electrodes 10 and 10' are formed along the striped ridges.

Next, pad electrodes comprising Ni—Ti—Au (1000 Å-1000 Å-8000 Å) are formed on the p electrodes, and the same pad electrodes are also formed on the n-electrodes.

On etching end faces which are formed by exposing the n-type contact layer, a mirror with a reflectance of 40% on a front end face of the stripe 16, and mirrors with reflectances of 90% on back end faces of the stripes 16 and 16', are respectively formed by way of photolithography.

After the n-electrodes and the p-electrodes are formed as described above, the wafer is divided into bars outside of an end face on an M-face (the M-face of GaN, such as (11-00)) in a direction perpendicular to the striped electrodes, so as to obtain a laser device whose resonator length is 650 μm.

In the stripes, the mirror formed on the front end face of the resonator was assumed to be the stripe for reading 16, and the mirror not formed on the front end face of the resonator was assumed to be the stripe for writing 16', and characteristics were evaluated. When the relaxation oscillation frequency is measured under a condition of 25° C., a pulse width of 10 ns, a pulse cycle of 20 ns, and a zero bias of 5 mW, the relaxation oscillation frequency $fr_1$ of the stripe 16 for reading was 1.9 GHz and the relaxation oscillation frequency $fr_2$ of the stripe 16' for writing was 1.4 GHz.

In the stripe for reading 16, the RIN value was −128 dB/Hz and a slope efficiency was 0.6 W/A at an output of 2.0 mW, and an output where the RIN value was −118 dB/Hz was 1.5 mW. On the other hand, in the stripe for writing 16', the RIN value was −118 dB/Hz and the slope efficiency was 1.2 W/A at the output of 2.0 mW, and an output where the RIN value was −125 dB/Hz was 4.0 mW.

When the obtained GaN-based semiconductor laser device was used in an optical disc information device and the output of the stripe for reading 16 was adjusted to 2.0 mW and the output of the stripe for writing was adjusted to 30 mW, the operation life was 5000 hours and controlled by the stripe for writing.

EXAMPLE 2

The GaN-based semiconductor laser device obtained in Example 1 was used at a double speed rate for writing in an optical disc information system. When the output of the stripe 16 for writing was 2.0 mW and the output of the stripe 16' for reading was 45 mW, an operating life was 2500 h because a rate was controlled by the stripe for writing.

COMPARATIVE EXAMPLE 1

Only the stripe for reading 16 in Example 1 was used for an optical disc information system and both of reading and writing were operated using one stripe. To adjust the RIN value at a time of reading to −125 dB/Hz, the output for reading was adjusted to 4.0 mW and the output for writing was adjusted to 60 mW. An operating life was 1500 hour in this condition, which was less than one third compared with Example 1. When the output for writing was adjusted to 84 mW in order to be used at a double speed rate in writing, the operating life was 1000 h, which was less than half compared with that of Example 2.

COMPARATIVE EXAMPLE 2

Only the stripe for writing 16 in Example 1 was used for the optical disc information system and both of reading and writing were operated using one stripe.

When the output for reading was adjusted to 2.0 mW and the output for writing was adjusted to 30 mW, an operating life was 1000 h, which was about one fifth compared with Example 1.

The GaN-based semiconductor laser device according to the present invention includes two or more striped structures formed in one chip, wherein one stripe is used for lower output and another stripe is used for higher output. Therefore, an excellent performance can be obtained at both lower output and higher output. Furthermore, a striped structure having a higher relaxation oscillation frequency fr and a striped structure having a lower relaxation oscillation frequency fr are formed. Therefore, the RIN value at lower output can be improved by the striped structure having higher relaxation oscillation frequency, and a single transverse mode and reliability at higher output can be obtained by the striped structure having lower relaxation oscillation frequency. Thus, by using the GaN-based semiconductor laser device related to the present invention in an optical information system, data can be transferred at high speed with a high RW ratio, while maintaining a required level of an RIN value and operating life.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

The invention claimed is:

1. A GaN-based semiconductor laser device comprising:
in one laser chip, an insulating substrate, a first striped structure on said insulating substrate and having a first relaxation oscillation frequency $fr_1$, and a second striped structure on said insulating substrate and having a second relaxation oscillation frequency $fr_2$,
wherein a length of said first striped structure is less than a length of said second striped structure, and an average of a front-face reflectance and a back-face reflectance of said first striped structure is greater than an average of a front-face reflectance and a back-face reflectance of said second striped structure, such that the first relaxation oscillation frequency $fr_1$ is greater than the second relaxation oscillation frequency $fr_2$, and
wherein a trench is between said first striped structure and said second striped structure, with said insulating substrate being exposed at a bottom of said trench such that a current path between said first striped structure and said second striped structure does not exist.

2. The GaN based semiconductor laser device according to claim 1, further comprising:
a first p-electrode on said first striped structure;
a second p-electrode on said second striped structure; and
an n-electrode on the same side of said one laser chip as is said p-electrodes.

3. The GaN based semiconductor laser device according to claim 2, wherein
said n-electrode is common to said first and second striped structures.

4. The GaN based semiconductor laser device according to claim 3, wherein
said n-electrode is adjacent to said second striped structure.

5. The GaN based semiconductor laser device according to claim 4, wherein
said first striped structure is for reading, and
said second striped structure is for writing.

6. The GaN-based semiconductor laser device according to claim 5, wherein
said first relaxation oscillation frequency $fr_1$ and said second relaxation oscillation frequency $fr_2$ satisfy a relational expression of $(fr_1-fr_2)/fr_2>0.1$.

7. The GaN-based semiconductor laser device according to claim 4, wherein
said first relaxation oscillation frequency $fr_1$ and said second relaxation oscillation frequency $fr_2$ satisfy a relational expression of $(fr_1-fr_2)/fr_2>0.1$.

8. The GaN-based semiconductor laser device according to claim 2, wherein
said first and second striped structures are between two regions, with said n-electrode being in one of two regions.

9. The GaN-based semiconductor laser device according to claim 8, further comprising:
another n-electrode in the other of said two regions.

10. The GaN based semiconductor laser device according to claim 1, wherein
said trench has a width that is increased adjacent a luminous region of said laser device.

11. The GaN-based semiconductor laser device according to claim 10, wherein
said first relaxation oscillation frequency $fr_1$ and said second relaxation oscillation frequency $fr_2$ satisfy a relational expression of $(fr_1-fr_2)/fr_2>0.1$.

12. The GaN-based semiconductor laser device according to claim 1, wherein
said first relaxation oscillation frequency $fr_1$ and said second relaxation oscillation frequency $fr_2$ satisfy a relational expression of $(fr_1-fr_2)/fr_2>0.1$.

13. The GaN-based semiconductor laser device according to claim 12, wherein
said first relaxation oscillation frequency $fr_1$ and said second relaxation oscillation frequency $fr_2$ satisfy a relational expression of $(fr_1-fr_2)/fr_2>0.6$.

14. The GaN-based semiconductor laser device according to claim 1, wherein
said first striped structure is to emit a first light having a first wavelength, and said second striped structure is to emit a second light having a second wavelength, with a difference between the first wavelength and the second wavelength being within 5 nm.

15. The GaN-based semiconductor laser device according to claim 1, wherein
a ratio of equivalent refractive indexes between a waveguide portion and a peripheral portion of said first striped structure is greater than a ratio of equivalent refractive indexes between a waveguide portion and a peripheral portion of said second striped structure.

16. The GaN-based semiconductor laser device according to claim 1, wherein at least one said first and second striped structures has an end face formed by etching.

* * * * *